(12) United States Patent
Sato et al.

(10) Patent No.: US 12,176,322 B2
(45) Date of Patent: Dec. 24, 2024

(54) ELECTRONIC APPARATUS AND METHOD FOR MANUFACTURING ELECTRONIC APPARATUS

(71) Applicant: FUJI ELECTRIC CO., LTD., Kanagawa (JP)

(72) Inventors: Narumi Sato, Matsumoto (JP); Yuta Tamai, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 318 days.

(21) Appl. No.: 17/727,809

(22) Filed: Apr. 25, 2022

(65) Prior Publication Data

US 2022/0399304 A1 Dec. 15, 2022

(30) Foreign Application Priority Data

Jun. 15, 2021 (JP) ................................ 2021-099262

(51) Int. Cl.
*H01L 23/00* (2006.01)

(52) U.S. Cl.
CPC .............. *H01L 24/83* (2013.01); *H01L 24/32* (2013.01); *H01L 2224/32225* (2013.01); *H01L 2224/45187* (2013.01); *H01L 2224/48887* (2013.01); *H01L 2224/83224* (2013.01)

(58) Field of Classification Search
CPC ..................... H01L 2224/48886–48888; H01L 2224/45186–45188
See application file for complete search history.

(56) References Cited

U.S. PATENT DOCUMENTS

2008/0206928 A1  8/2008  Onishi

FOREIGN PATENT DOCUMENTS

| | | |
|---|---|---|
| JP | H0671467 A | 3/1994 |
| JP | H10189639 A | 7/1998 |
| JP | 2008207207 A | 9/2008 |
| JP | 2009218280 A | 9/2009 |
| JP | 2017098302 A | 6/2017 |
| WO | 2013153673 A1 | 10/2013 |

*Primary Examiner* — Amar Movva

(57) ABSTRACT

Provided is an electronic apparatus including a metal wiring. The metal wiring includes a plurality of first regions covered with a solder layer, a second region provided between two first regions of the plurality of first regions, and a third region having a nitrogen amount of 20 atoms % or more. An oxygen amount is largest in the second region, followed by at least one of the plurality of first regions, and then by the third region. The nitrogen amount may be largest in the third region, followed by at least one of the plurality of first regions, and then by the second region.

20 Claims, 10 Drawing Sheets

ELECTRONIC APPARATUS AND METHOD FOR MANUFACTURING ELECTRONIC APPARATUS

The contents of the following Japanese patent application are incorporated herein by reference:
NO. 2021-099262 filed in JP on Jun. 15, 2021.

BACKGROUND

1. Technical Field

The present invention relates to an electronic apparatus and a method for manufacturing the electronic apparatus.

2. Related Art

Conventionally, there has been known a technique of irradiating an electronic apparatus such as a semiconductor module with a laser beam to clean and scrub the electronic apparatus (see, for example, Patent Documents 1 to 3). In addition, a technique is known in which an electronic apparatus provided with a solder layer as a bonding member is irradiated with a laser beam to suppress wet-spreading of the solder layer (see, for example, Patent Documents 4 to 6).
Patent Document 1: Japanese Patent Application Publication No. 10-189639
Patent Document 2: Japanese Patent Application Publication No. 2017-98302
Patent Document 3: Japanese Patent Application Publication No. 6-71467
Patent Document 4: International Publication No. 2013-153673
Patent Document 5: Japanese Patent Application Publication No. 2008-207207
Patent Document 6: Japanese Patent Application Publication No. 2009-218280

DESCRIPTION OF EXEMPLARY EMBODIMENTS

Figure 1:
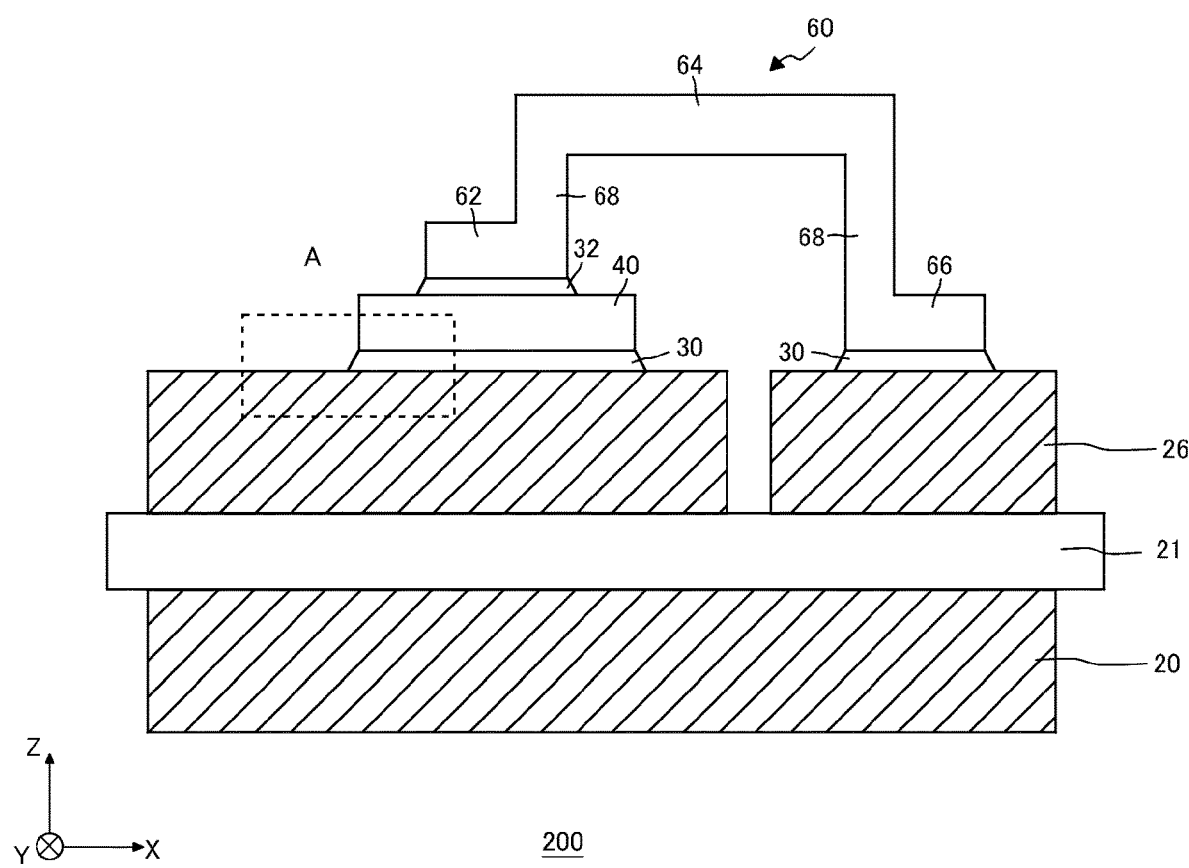
FIG. 1 is a diagram illustrating an example of an electronic apparatus 200 according to a comparative example of the present invention.

Hereinafter, the present invention will be described through embodiments of the invention, but the following embodiments do not limit the invention according to the claims. In addition, not all combinations of features described in the embodiments are essential to the solution of the invention. Note that, in the present specification and the drawings, elements having substantially the same function and configuration are denoted by the same reference numerals, and redundant description is omitted, and elements not directly related to the present invention are not illustrated. In one drawing, elements having the same function and configuration are representatively denoted by a reference numeral, and the reference numerals for the others may be omitted.

As used herein, one side in a direction parallel to a depth direction of a semiconductor chip is referred to as "upper" and the other side is referred to as "lower". One surface of two principal surfaces of a substrate, a layer or other member is referred to as an upper surface, and the other surface is referred to as a lower surface. "Upper" and "lower" directions are not limited to a direction of gravity, or a direction in which an electronic apparatus is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. Note that a +Z axis direction and a −Z axis direction are directions opposite to each other. When the Z axis direction is described without describing the signs, it means that the direction is parallel to the +Z axis and the −Z axis. In the present specification, orthogonal axes parallel to the upper surface and the lower surface of the semiconductor chip are referred to as the X axis and the Y axis. Further, an axis perpendicular to the upper surface and the lower surface of the semiconductor chip is referred to as the Z axis. In the present specification, the direction of the Z axis may be referred to as the depth direction. Further, in the present specification, a direction parallel to the upper surface and the lower surface of the semiconductor chip may be referred to as a horizontal direction, including an X axis direction and a Y axis direction.

In the present specification, a case where a term such as "same" or "equal" is mentioned may include a case where an error due to a variation in manufacturing or the like is included. The error is, for example, within 10%.

FIG. 1 is a diagram illustrating an example of an electronic apparatus 200 according to a comparative example of the present invention. In the present example, the electronic apparatus 200 is a semiconductor module on which a semiconductor chip is placed. The electronic apparatus 200 may function as a power conversion device such as an inverter. The electronic apparatus 200 may be a device having no semiconductor chip. The electronic apparatus 200 may include a capacitor or the like. The electronic apparatus 200 includes a heat dissipation plate 20, an insulating substrate 21, a metal wiring 26, a solder layer 30, a solder layer 32, a semiconductor chip 40, and a lead frame 60.

The electronic apparatus 200 includes one or more insulating substrates 21. The metal wiring 26 is provided on one surface of the insulating substrate 21, and the heat dissipation plate 20 is provided on the other surface of the insulating substrate 21. The metal wiring 26 is provided with a predetermined circuit pattern. The metal wiring 26 may be constituted by directly bonding a copper plate, an aluminum plate, or a plate obtained by plating these materials to the insulating substrate 21 such as silicon nitride ceramics or aluminum nitride ceramics, or by bonding these plates with a brazing material layer interposed therebetween.

One or more semiconductor chips 40 are placed on the metal wiring 26. In the example of FIG. 1, one semiconductor chip 40 is placed. The solder layer 30 is provided above the metal wiring 26. The solder layer 30 bonds the semiconductor chip 40 or the lead frame 60 to the metal wiring 26. The solder layer 30 may be formed of the same material as the solder layer 32. The semiconductor chip 40 is protected by a resin package such as a resin case (not illustrated) surrounding the insulating substrate 21 and a sealing resin (sealing resin) filled in the resin case. Note that the resin case may not be provided, and the semiconductor chip 40 and the like may be protected by transfer molding or the like using a sealing resin.

The semiconductor chip 40 may include a diode such as an IGBT or a free wheel diode (FWD), a reverse conducting (RC)-IGBT obtained by combining these diodes, a MOS transistor, and the like.

The semiconductor chip 40 of the present example is a vertical chip in which metal electrodes (for example, an emitter electrode and a collector electrode) are formed on an upper surface and a lower surface. The semiconductor chip 40 is connected to the metal wiring 26 through the metal electrode formed on the lower surface, and connected to a wiring member (the lead frame 60 in the present example) through the metal electrode formed on the upper surface. Note that the semiconductor chip 40 is not limited to a vertical chip. The semiconductor chip 40 may have a metal electrode connected to the metal wiring 26 by a wire or the like on the upper surface.

The heat dissipation plate 20 dissipates heat from the semiconductor chip 40 via the insulating substrate 21 and the like. A cooling portion containing a refrigerant such as water may be provided on the lower surface of the heat dissipation plate 20.

The upper surface of the semiconductor chip 40 is connected to a wiring member via the solder layer 32 which is a bonding member. The wiring member of the present example is the lead frame 60. The lead frame 60 is a member formed of a metal material such as copper or aluminum. At least a part of the surface of the lead frame 60 may be plated with nickel or the like. Further, at least a part of the surface of the lead frame 60 may be coated with resin or the like. The lead frame 60 may have a plate-shaped portion. The plate shape refers to a shape in which the areas of two main surfaces provided opposite to each other are larger than the areas of the other surfaces. At least a portion of the lead frame 60 connected to the semiconductor chip 40 may have a plate shape. The lead frame 60 may be formed by bending one metal plate.

The lead frame 60 electrically connects the semiconductor chip 40 and the metal wiring 26. A main current may flow through the lead frame 60. Here, the main current is a maximum current among the currents flowing through the semiconductor chip 40. The lead frame 60 of the present example includes a chip connecting portion 62, a bridging portion 64, a circuit pattern connecting portion 66, and a foot portion 68. The chip connecting portion 62 is a portion connected to the upper surface of the semiconductor chip 40. The circuit pattern connecting portion 66 is a portion connected to the upper surface of the metal wiring 26. The chip connecting portion 62 and the circuit pattern connecting portion 66 may be plate-shaped portions substantially parallel to the XY plane. Therefore, the chip connecting portion 62 and the circuit pattern connecting portion 66 may be plate-shaped portions substantially parallel to the upper surface of the semiconductor chip 40. Note that "substantially parallel" refers to, for example, a state where the angle is 10 degrees or less.

The foot portion 68 is a portion extending in the Z axis direction. The bridging portion 64 connects the chip connecting portion 62 and the circuit pattern connecting portion 66 via the foot portion 68. The bridging portion 64 is provided away from a conductive member such as the metal wiring 26. The bridging portion 64 of the present example is provided above the metal wiring 26 and the like, and is provided from the chip connecting portion 62 to the circuit pattern connecting portion 66 so as to straddle the metal wiring 26 and the like.

The solder layer 32 is formed between the upper surface of the semiconductor chip 40 and the lower surface of the chip connecting portion 62 of the lead frame 60. The solder layer 32 mechanically and electrically connects the semiconductor chip 40 and the chip connecting portion 62. In the present example, lead-free solder is used as the solder layer 32. The lead-free solder is mainly composed of, for example, at least one of an alloy of tin-silver-copper, an alloy of tin-zinc-bismuth, an alloy of tin-copper, and an alloy of tin-silver-indium-bismuth. The solder layer 32 may have a fillet on the side surface. The solder layer 32 may be provided only between the upper surface of the semiconductor chip 40 and the lower surface of the chip connecting portion 62 of the lead frame 60.

Figure 2:
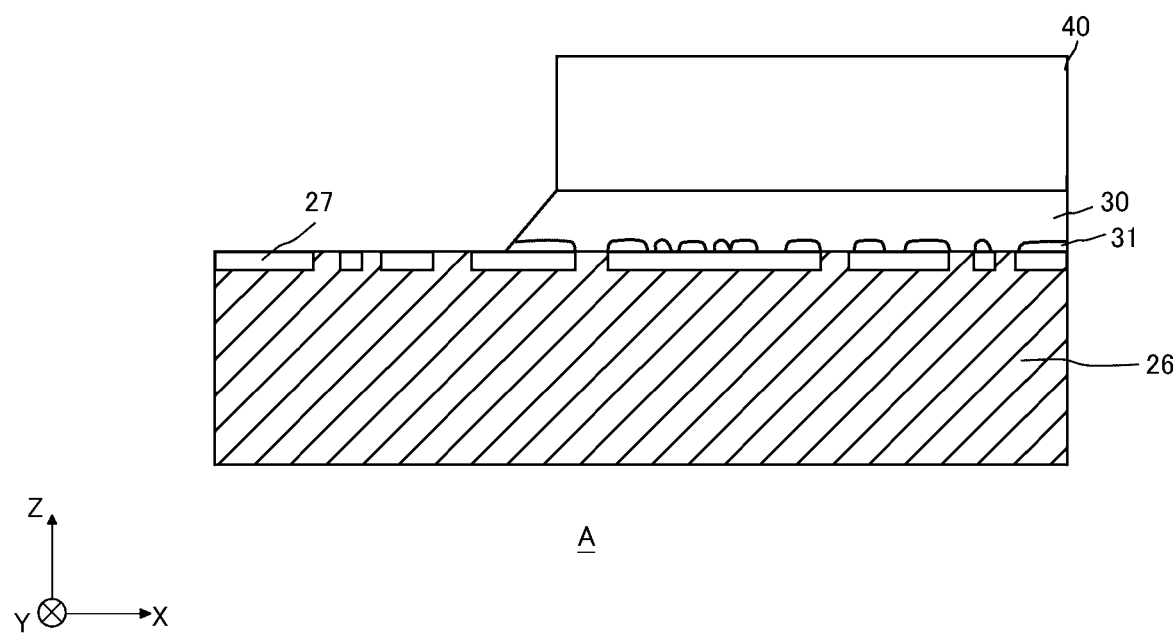
FIG. 2 is a diagram illustrating an example of a region A in FIG. 1.

FIG. 2 is a diagram illustrating an example of a region A in FIG. 1. FIG. 2 illustrates an arrangement of the metal wiring 26, the solder layer 30, and the semiconductor chip 40.

Surface dirt 27 may be present in the metal wiring 26. The surface dirt 27 in the present specification includes dirt caused by a nitrogen element. If the surface dirt 27 is present, the solder does not wet-spread uniformly when the solder layer 30 is formed, and voids 31 are formed in the solder layer 30. When the voids 31 are present, a bonding failure between the semiconductor chip 40 and the metal wiring 26 may occur. In addition, since the surface dirt 27 includes dirt caused by the nitrogen element, the voids 31 are formed in the vicinity of the interface between the solder layer 30 and the metal wiring 26, which makes it difficult to detect the voids by a normal inspection method.

Figure 3:
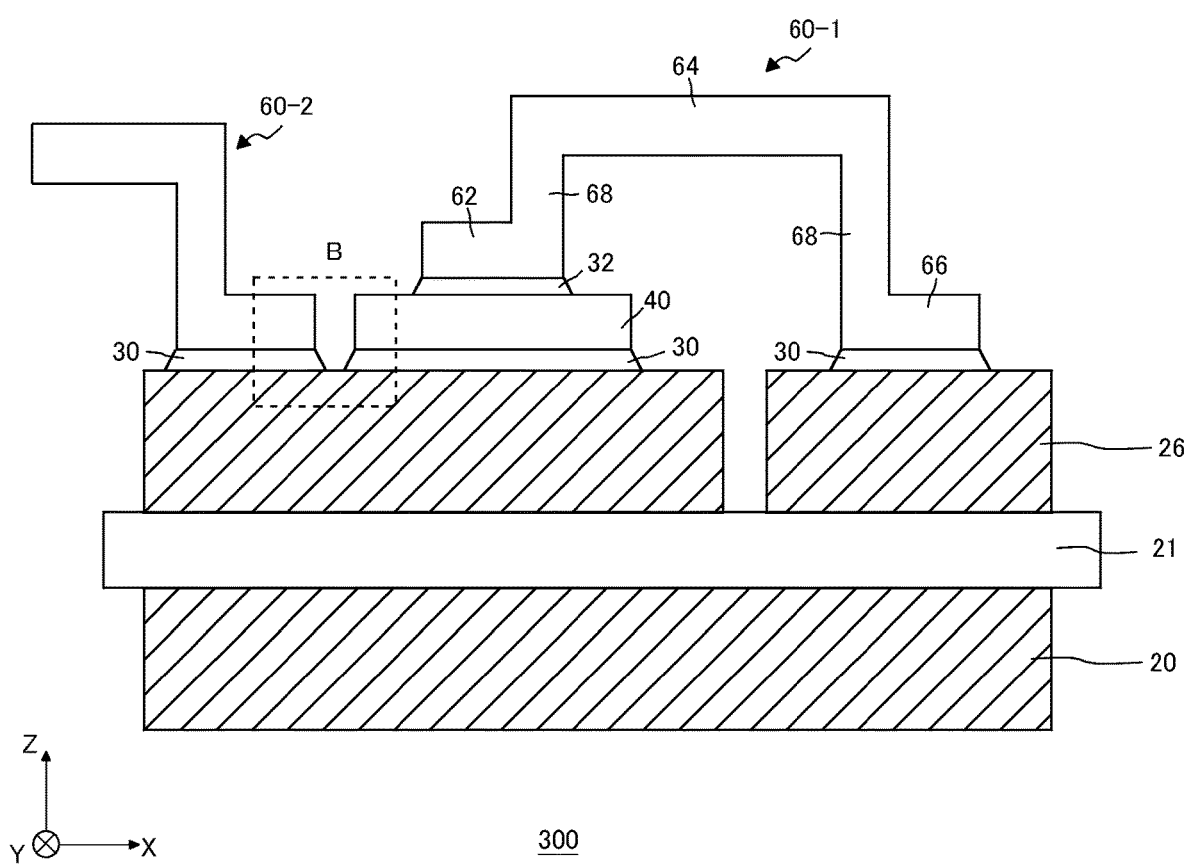
FIG. 3 is a diagram illustrating an example of an electronic apparatus 300 according to a comparative example of the present invention.

FIG. 3 is a diagram illustrating an example of an electronic apparatus 300 according to a comparative example of the present invention. The electronic apparatus 300 of FIG. 3 is different from the electronic apparatus 200 of FIG. 1 in that it further includes a lead frame 60-2 and the solder layer 30 provided below the lead frame 60-2. The configuration of the electronic apparatus 300 other than the vicinity of the lead frame 60-2 may be the same as that of the electronic apparatus 200. A lead frame 60-1 in FIG. 3 is the same as the lead frame 60 in FIG. 1. The lead frame 60-2 is bonded to the metal wiring 26 via the solder layer 30.

Figure 4:
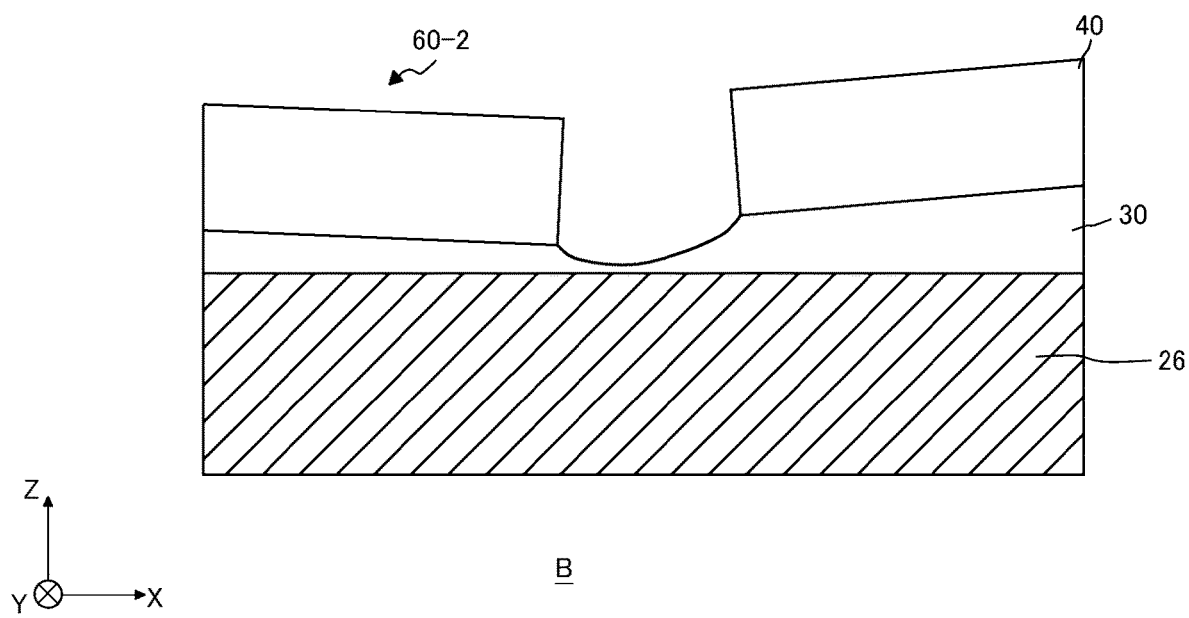
FIG. 4 is a diagram illustrating an example of a region B in FIG. 3.

FIG. 4 is a diagram illustrating an example of a region B in FIG. 3. FIG. 4 illustrates an arrangement of the metal wiring 26, the solder layer 30, the semiconductor chip 40, and the lead frame 60-2.

When the electronic apparatus is downsized, an installation interval of the semiconductor chip 40 and the wiring member is narrowed. Therefore, when one solder layer 30 wet-spreads, it is conceivable that such solder layer comes into contact with another solder layers 30. In FIG. 4, the solder layer 30 below the semiconductor chip 40 is in contact with the solder layer 30 of the lead frame 60-2. When the solder layer 30 is in contact, the thickness of the solder layer 30 may deviate from the thickness of the solder layer required under each semiconductor chip 40 and each wiring member. In the example of FIG. 4, since the solder layer 30 below the semiconductor chip 40 and the lead frame 60-2 is thin, the semiconductor chip 40 and the lead frame 60-2 each are inclined. Therefore, there is a possibility that a defective product is generated in the electronic apparatus 300.

Figure 5:
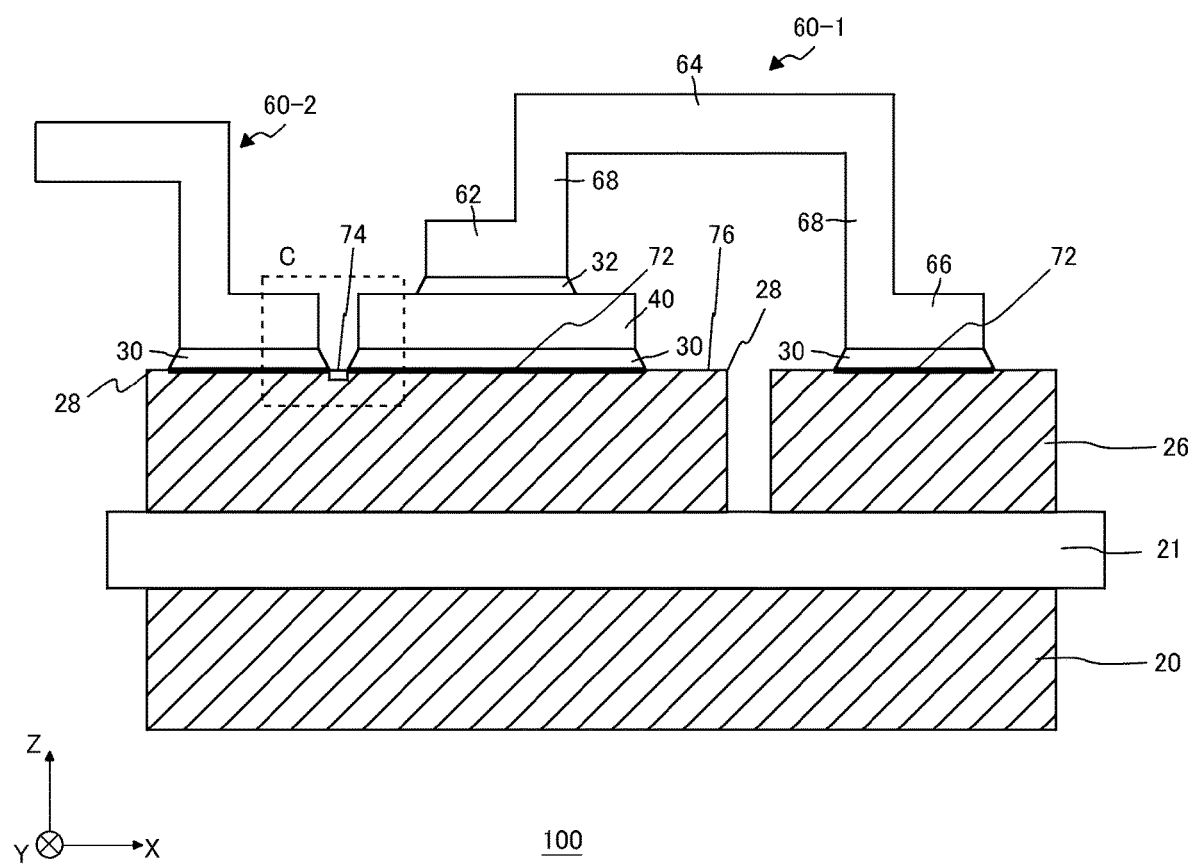
FIG. 5 is a diagram illustrating an example of an electronic apparatus 100 according to one embodiment of the present invention.

FIG. 5 is a diagram illustrating an example of an electronic apparatus 100 according to one embodiment of the present invention. The electronic apparatus 100 of FIG. 5 is different from the electronic apparatus 300 of FIG. 3 in that the metal wiring 26 includes a first region 72 and a second region 74. The configuration other than the metal wiring 26 in FIG. 5 may be the same as that in FIG. 3.

The metal wiring 26 includes the first region 72. The first region 72 is a region in which at least a part thereof is covered with the solder layer 30. In FIG. 5, the entire first region 72 is covered with the solder layer 30. The first region 72 is provided on the surface of the metal wiring 26. In FIG. 5, the first region 72 is provided on the upper surface of the metal wiring 26. The metal wiring 26 includes a plurality of first regions 72. In FIG. 5, the first region 72 is provided below each of the three solder layers 30. In FIG. 5, the range of the first region 72 is indicated by a thick line. The first region 72 may be provided in a wider range than the semiconductor chip 40 in the horizontal direction.

The metal wiring 26 includes the second region 74. The second region 74 is provided between two first regions 72 among the plurality of first regions 72. The second region 74 is provided on the surface of the metal wiring 26. In FIG. 5, the second region 74 is provided on the upper surface of the metal wiring 26. The second region 74 may be formed deeper than the first region 72.

The metal wiring 26 includes a third region 76. The third region 76 is provided on the surface of the metal wiring 26 other than the surface on which the first region 72 or the second region 74 is provided. In the present example, the third region 76 is provided on the upper surface of the metal wiring 26. The third region 76 may be provided on the side surface of the metal wiring 26 or may be provided on the lower surface of the metal wiring 26 in contact with the insulating substrate 21.

In the present example, the first region 72 and the second region 74 are formed by irradiating the metal wiring 26 with a laser beam having a predetermined energy density. The energy density of the laser beam is a unit of intensity of the laser beam, and a specific numerical value thereof will be described later. The third region 76 is a region of the metal wiring 26 that is not irradiated with a laser beam. Since the first region 72 and the second region 74 are irradiated with a laser beam, the surface dirt caused by the nitrogen element can be removed. The surface dirt is not removed from the third region 76 because the third region 76 is not irradiated with a laser beam. As will be described in detail with reference to FIG. 9, the nitrogen amount of the third region 76 from which the surface dirt is not removed is 20 atoms % or more. The nitrogen amounts of the first region 72 and the second region 74 may be equal to or less than a predetermined amount. In the present specification, the nitrogen amount is the amount of nitrogen detected in each region.

The energy density of the laser beam used for forming the first region 72 is different from the energy density of the laser beam used for forming the second region 74. In the present example, the energy density of the laser beam used for forming the second region 74 is larger than the energy density of the laser beam used for forming the first region 72.

By irradiating with a higher energy density, the oxygen element in the irradiation region can be increased. By increasing the oxygen element, wet-spreading of the solder layer 30 can be suppressed. Since the energy density to be irradiated is largest in the second region 74, followed by the first region 72, and then by the third region 76, an oxygen amount is largest in the second region 74, followed by the first region 72, and then by the third region 76. In the present specification, the oxygen amount is the amount of oxygen detected in each region.

An example of the arrangement of the first region 72, the second region 74, and the third region 76 is not limited to FIG. 5. For example, the second region 74 is disposed in the vicinity of a corner 28 which is a corner where the upper surface of the metal wiring 26 and the side surface of the metal wiring 26 are in contact with each other. By disposing the second region 74 in the vicinity of the corner 28, wet-spreading of the solder layer 30 to the side surface of the metal wiring 26 can be suppressed. The first region 72 may be provided in the side surface of the metal wiring 26. The third region 76 may not be provided in the upper surface of the metal wiring 26.

Figure 6:
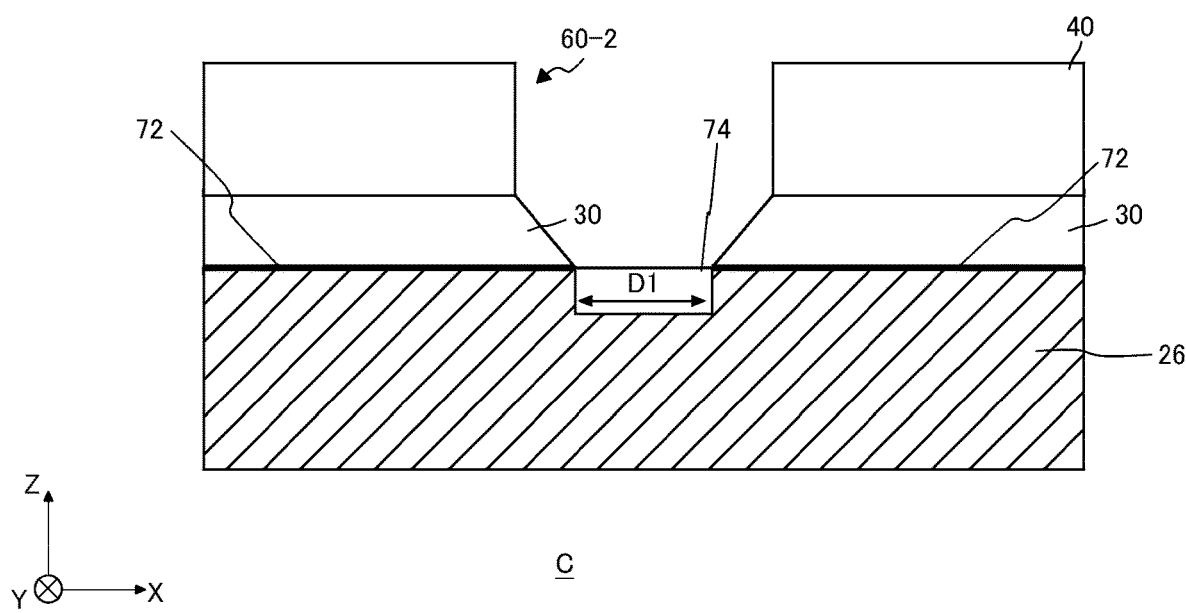
FIG. 6 is a diagram illustrating an example of a region C in FIG. 5.

FIG. 6 is a diagram illustrating an example of a region C in FIG. 5. In the region C, the arrangement of the metal wiring 26, the solder layer 30, the semiconductor chip 40, and the lead frame 60-2 is illustrated.

Since the first region 72 of the metal wiring 26 is formed by a laser beam, generation of voids in the solder layer 30 can be suppressed. Therefore, the occurrence of a bonding failure can be prevented. In addition, since the oxygen amount of the second region 74 is larger than the oxygen amount of the first region 72 and the oxygen amount of the third region 76, wet-spreading of the solder layer 30 can be suppressed, and contact of the solder layer 30 can be prevented. As described above, defects caused by the solder layer 30 can be reduced.

In FIG. 6, the minimum width of the second region 74 is D1. The minimum width D1 of the second region 74 may be 150 μm or more. When the minimum width D1 of the second region 74 is too small, contact of the solder layer 30 is likely to occur, so that the minimum width D1 of the second region 74 is preferably 150 μm or more. When the energy density of the laser beam used for forming the second region 74 is increased, wet-spreading of the solder layer 30 can be further suppressed, so that the minimum width D1 of the second region 74 may be 150 μm or less.

Figure 7:
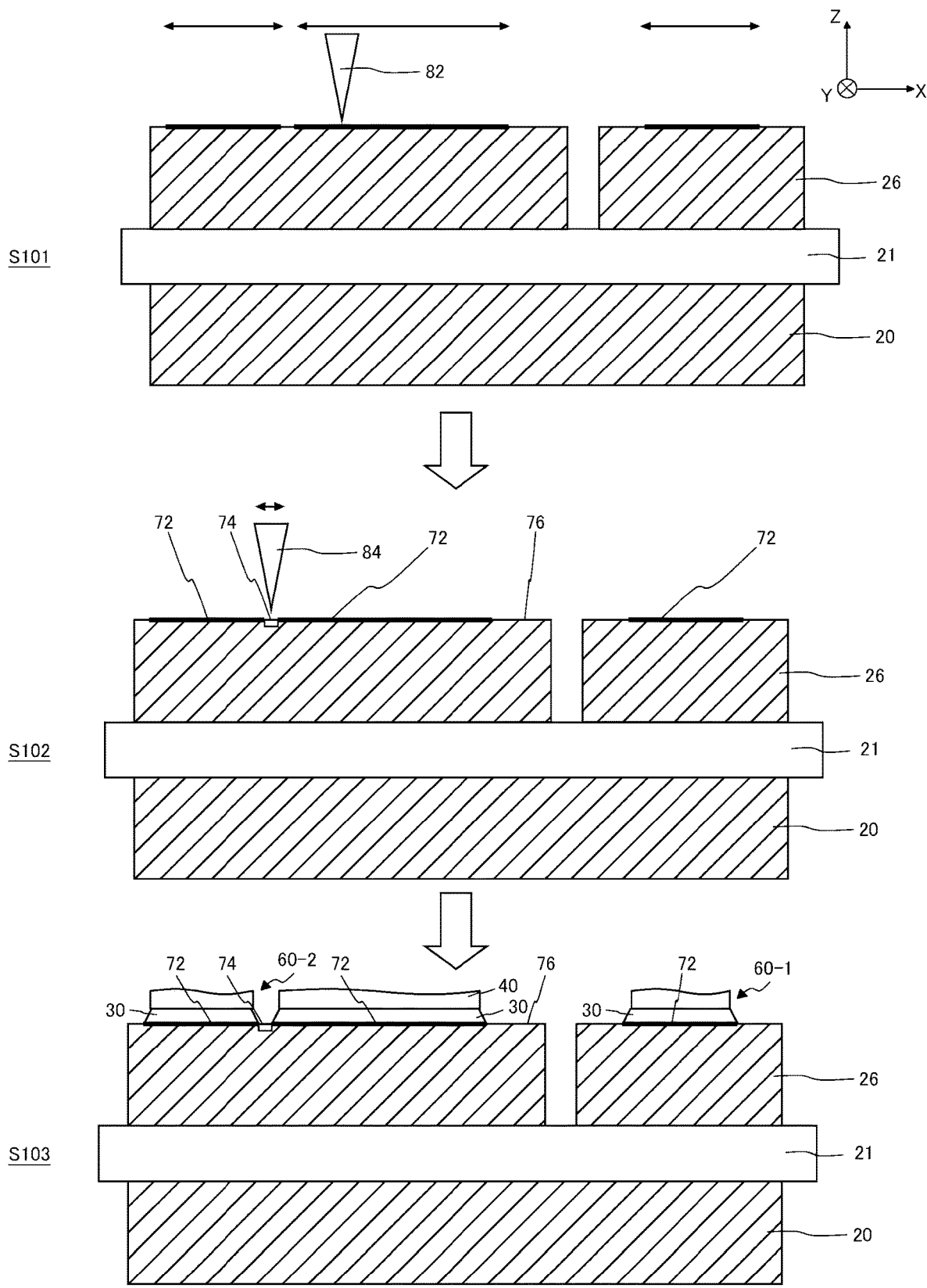
FIG. 7 is a diagram for explaining an example of a method for manufacturing the electronic apparatus 100.

FIG. 7 is a diagram for explaining an example of a method for manufacturing the electronic apparatus 100. The method for manufacturing the electronic apparatus 100 includes a first laser irradiation step S101, a second laser irradiation step S102, and a solder layer forming step S103. Before the first laser irradiation step S101, the metal wiring 26 is provided above the insulating substrate 21.

In the first laser irradiation step S101, the metal wiring 26 is irradiated with a first laser beam 82. In the first laser irradiation step S101, the region where the first region 72 is formed is irradiated with the first laser beam 82. In the present example, only the region where the first region 72 is formed is irradiated with the first laser beam 82. Therefore, the first region 72 is formed by the first laser beam 82. In FIG. 7, the range irradiated with the first laser beam 82 is indicated by an arrow.

The first laser beam 82 may be irradiated by a laser irradiation device (not illustrated in the present specification). The first laser beam 82 is, as an example, a pulse laser. The laser irradiation device continuously irradiates the first laser beam 82. When the diameter of the laser beam is too large, the energy density cannot be increased. On the other hand, when the diameter of the laser beam is too small, the throughput decreases. The diameter of the laser beam is preferably set appropriately from the viewpoint of energy density and throughput. The diameter of the first laser beam 82 is, as an example, 100 µm or less. The wavelength of the first laser beam 82 is, as an example, 600 nm or less. Note that the energy density of the first laser beam 82 will be described with reference to FIG. 9.

In the second laser irradiation step S102, the metal wiring 26 is irradiated with a second laser beam 84. The second laser beam 84 has an energy density different from that of the first laser beam 82. In the second laser irradiation step S102, the region where the second region 74 is formed is irradiated with the second laser beam 84. In the present example, only the region where the second region 74 is formed is irradiated with the second laser beam 84. Therefore, the second region 74 is formed by the second laser beam 84. In FIG. 7, the range irradiated with the second laser beam 84 is indicated by an arrow. The first region 72, the second region 74, and the third region 76 are formed in the metal wiring 26 by the first laser irradiation step S101 and the second laser irradiation step S102.

The second laser beam 84 may be emitted by a laser irradiation device similarly to the first laser beam 82. The first laser beam 82 and the second laser beam 84 may be irradiated by the same laser irradiation device. The second laser beam 84 is, as an example, a pulse laser. The laser irradiation device continuously irradiates the second laser beam 84. In the case of the same laser irradiation device, the second laser beam 84 can have an energy density different from that of the first laser beam 82 by changing the output setting and the frequency setting of the laser irradiation device. The diameter of the second laser beam 84 is, as an example, 50 µm or less. The wavelength of the second laser beam 84 is, as an example, 600 nm or less. The energy density of the second laser beam 84 will be described with reference to FIG. 9.

In the solder layer forming step S103, the solder layer 30 is formed. The solder layer 30 is formed so as to cover the first region 72. The solder layer 30 may be formed by melting and solidifying a necessary amount of plate solder. The plate solder may be disposed between the semiconductor chip 40 or the lead frame 60 and the metal wiring 26. The solder layer 30 is formed by placing the electronic apparatus 100 in a hydrogen reducing furnace and passing through a heating and cooling process. Since the solder layer 30 is formed so as to cover the first region 72, the occurrence of voids can be suppressed, and the occurrence of bonding failure can be prevented.

Figure 8:
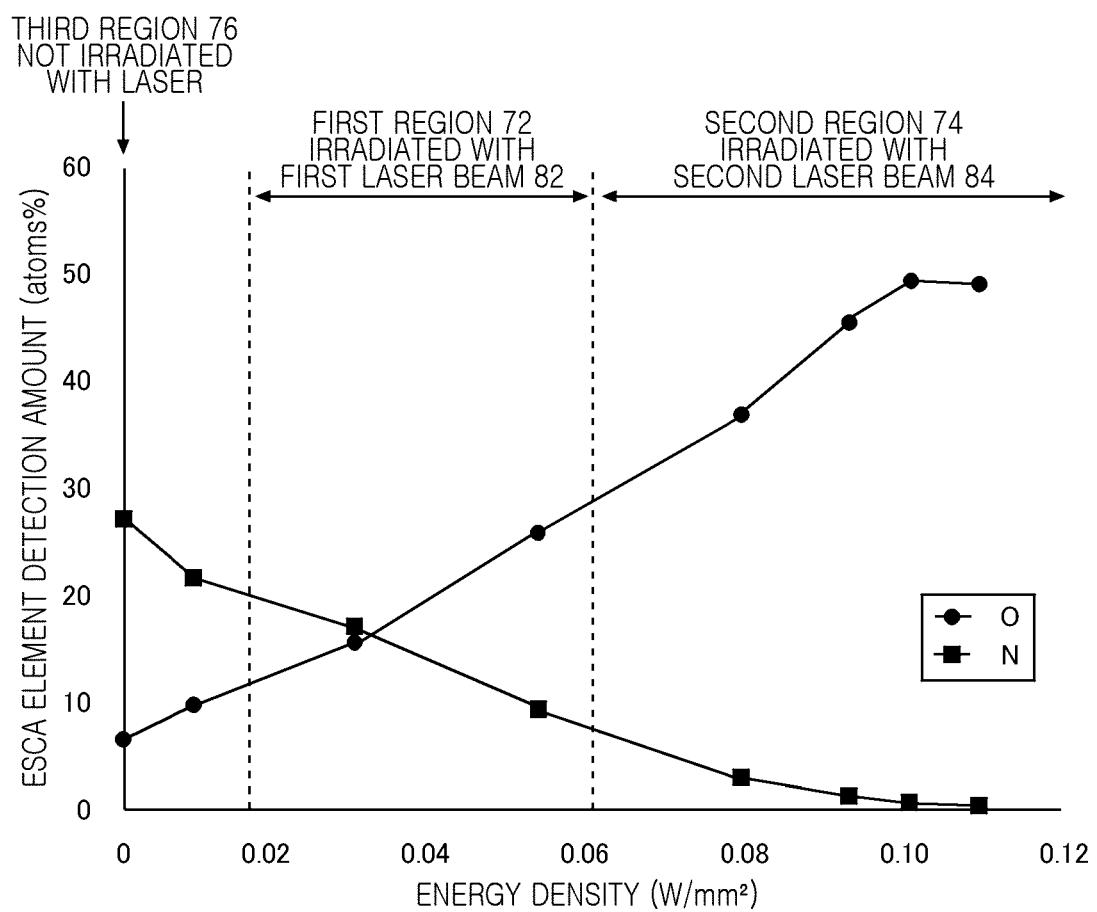
FIG. 8 is a diagram illustrating a relationship between the energy density of a laser beam and an ESCA element detection amount of an irradiation region.

FIG. 8 is a diagram illustrating a relationship between the energy density of the laser beam and an ESCA element detection amount of an irradiation region. ESCA (Electron Spectroscopy for Chemical Analysis) is a method of surface analysis, and is also called X-ray photoelectron spectroscopy. In FIG. 8, the horizontal axis indicates the ESCA element detection amount of the irradiation region irradiated with a laser beam having the energy density corresponding to the horizontal axis. In FIG. 8, the ESCA element detection amounts of oxygen and nitrogen are illustrated.

As illustrated in FIG. 8, as the energy density of the laser beam is increased, the oxygen amount of the irradiation region is increased. Therefore, by making the energy density of the second laser beam 84 larger than the energy density of the first laser beam 82, the oxygen amount can be largest in the second region 74, followed by the first region 72, and then by the third region 76.

As illustrated in FIG. 8, as the energy density of the laser beam is increased, the nitrogen amount of the irradiation region is decreased. Therefore, since the first region 72 and the second region 74 are irradiated with a laser beam, the surface dirt caused by the nitrogen element can be removed.

In the present example, the energy density of the second laser beam 84 is 0.06 W/mm$^2$ or more. The energy density of the second laser beam 84 may be 0.10 W/mm$^2$ or less. In the present example, the energy density of the first laser beam 82 is less than 0.06 W/mm$^2$. The energy density of the first laser beam 82 may be 0.015 W/mm$^2$ or more. By setting the energy densities of the first laser beam 82 and the second laser beam 84 in this manner, the first region 72, the second region 74, and the third region 76 can be formed.

The first region 72 is a region irradiated with the first laser beam 82. Therefore, as illustrated in FIG. 8, the oxygen amount of the first region 72 may be less than 30 atoms %. The oxygen amount of the first region 72 may be less than 25 atoms %. The oxygen amount of the first region 72 may be less than 20 atoms %. The oxygen amount of the first region 72 may be 10 atoms % or more. The oxygen amount of the first region 72 may be 15 atoms % or more.

The nitrogen amount of the first region 72 may be 20 atoms % or less. The nitrogen amount of the first region 72 may be 15 atoms % or less. The nitrogen amount of the first region 72 may be 5 atoms % or more. The nitrogen amount of the first region 72 may be 10 atoms % or more.

The second region 74 is a region irradiated with the second laser beam 84. Therefore, as illustrated in FIG. 8, the oxygen amount of the second region 74 may be 30 atoms % or more. The oxygen amount of the second region 74 may be 35 atoms % or more. The oxygen amount of the second region 74 may be 50 atoms % or less. The oxygen amount of the second region 74 may be 45 atoms % or less. The oxygen amount of the second region 74 may be twice or more of the oxygen amount of the first region 72.

The nitrogen amount of the second region 74 may be less than 10 atoms %. The nitrogen amount of the second region 74 may be less than 5 atoms %. The nitrogen amount of the second region 74 may be half or less of the nitrogen amount of the first region 72.

The third region 76 is a region that is not irradiated with a laser beam. Therefore, as illustrated in FIG. 8, the nitrogen amount of the third region 76 may be 20 atoms % or more. The nitrogen amount of the third region 76 may be 25 atoms % or more. In the present example, the nitrogen amount is largest in the third region 76, followed by the first region 72, and then by the second region 74. The oxygen amount of the third region 76 may be less than 10 atoms %.

As described above, the first region 72, the second region 74, and the third region 76 can be formed by controlling the energy density of the first laser beam 82 and the second laser beam 84. Note that the oxygen amounts and the nitrogen amounts of the first region 72, the second region 74, and the third region 76 may be analyzed by removing the solder layer 30. The oxygen amounts and the nitrogen amounts of the first region 72, the second region 74, and the third region 76 are preferably analyzed under an atmosphere without oxygen and nitrogen.

Figure 9:
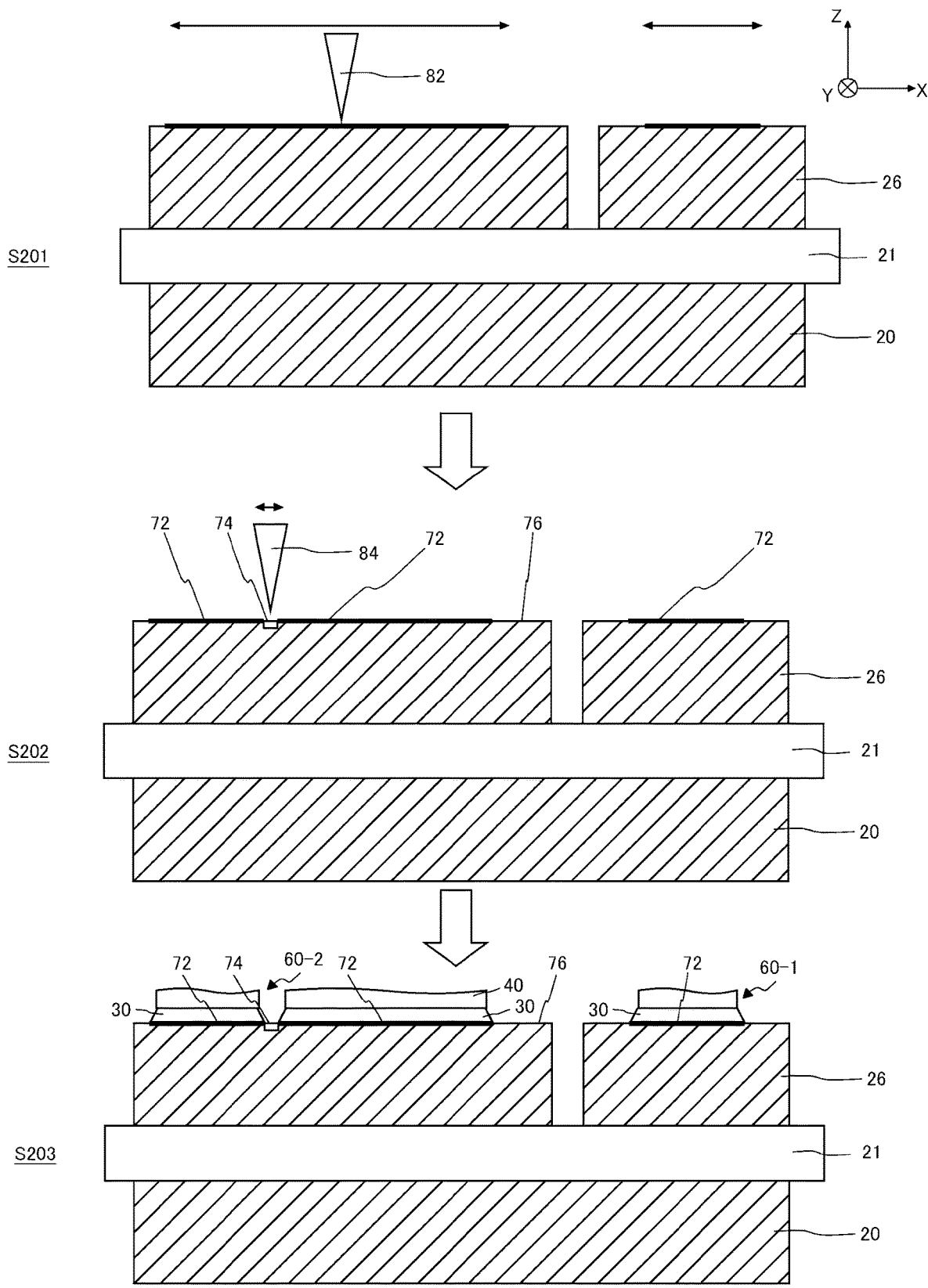
FIG. 9 is a diagram for explaining another example of the method for manufacturing the electronic apparatus 100.

FIG. 9 is a diagram for explaining another example of the method for manufacturing electronic apparatus 100. The method for manufacturing the electronic apparatus 100 includes a first laser irradiation step S201, a second laser irradiation step S202, and a solder layer forming step S203. The second laser irradiation step S202 may be the same as the second laser irradiation step S102 in FIG. 7. The solder layer forming step S203 may be the same as the solder layer forming step S103 of FIG. 7.

In the first laser irradiation step S201, the metal wiring 26 is irradiated with the first laser beam 82. In the first laser irradiation step S201, the region where the first region 72 is formed and the region where the second region 74 is formed are irradiated with the first laser beam 82. That is, the second region 74 is irradiated with the first laser beam 82 and the second laser beam 84. In FIG. 9, the range irradiated with the first laser beam 82 is indicated by an arrow. In the present example, since the region where the second region 74 is formed is also irradiated with the first laser beam 82, the oxygen amount of the second region 74 can be increased. In the present example, the energy densities of the first laser beam 82 and the second laser beam 84 may be the same as those in the example described in FIG. 8.

Figure 10:
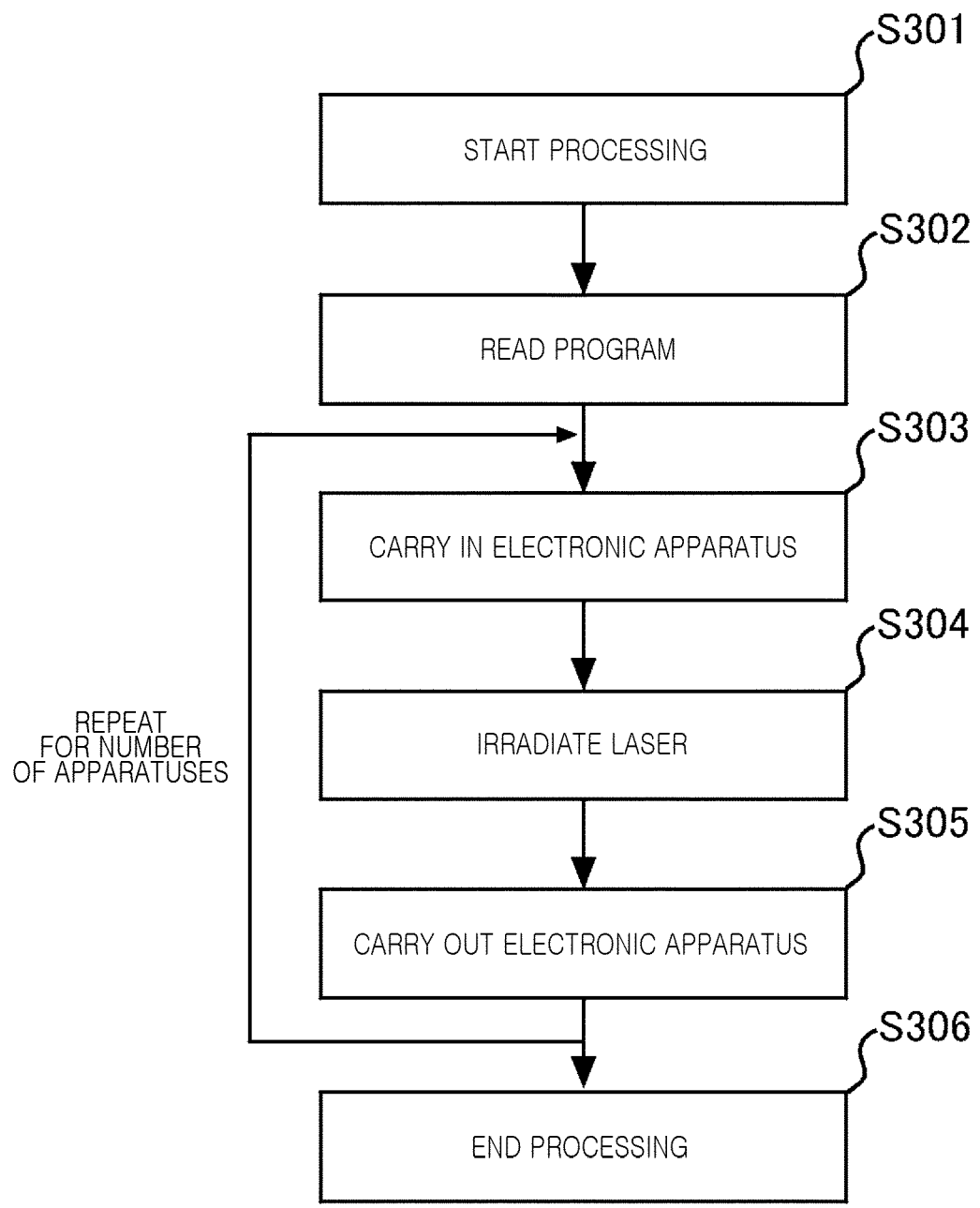
FIG. 10 is a diagram illustrating a flowchart of laser irradiation of a laser irradiation device.

FIG. 10 is a diagram illustrating a flowchart of laser irradiation of the laser irradiation device. At the start of processing, a laser processing device starts the processing (S301).

After starting the processing, the laser processing device reads a program. The contents of the program include information on laser beam irradiation conditions (S302). The information on the laser beam irradiation conditions includes, for example, information on the range of the irradiation region in the metal wiring 26 or information on the energy density of the laser beam to be irradiated. The laser beam irradiation conditions can be registered in the program in advance.

Next, the electronic apparatus 100 is carried in (S303). After the electronic apparatus 100 is carried in, laser irradiation is started (S304). The laser processing device emits a laser beam based on the read program. The laser processing device may continuously perform a first laser irradiation step and a second laser irradiation step. After the laser irradiation, the electronic apparatus 100 is carried out (S305). Therefore, the first laser irradiation step and the second laser irradiation step can be continuously performed in one laser processing device.

After the electronic apparatus 100 is carried out, another electronic apparatus 100 may be carried in. S303 to S305 may be repeated for the number of electronic apparatuses 100 to be processed. At this time, the laser beam irradiation conditions of the electronic apparatuses 100 may be set. After all the electronic apparatuses 100 are processed, the processing ends (S306).

While the embodiments of the present invention have been described, the technical scope of the invention is not limited to the above described embodiments. It is apparent to persons skilled in the art that various alterations or improvements can be added to the above-described embodiments. It is also apparent from the scope of the claims that the embodiments added with such alterations or improvements can be included in the technical scope of the invention.

What is claimed is:

1. An electronic apparatus comprising:
a metal wiring, wherein
the metal wiring includes:
a plurality of first regions covered with a solder layer;
a second region provided between two of the plurality of first regions; and
a third region whose nitrogen amount is 20 atoms % or more, and an oxygen amount is largest in the second region, followed by at least one of the plurality of first regions, and then by the third region.

2. The electronic apparatus according to claim 1, wherein a nitrogen amount is largest in the third region, followed by at least one of the plurality of first regions, and then by the second region.

3. The electronic apparatus according to claim 1, wherein the oxygen amount of at least one of the plurality of first regions is less than 30 atoms %.

4. The electronic apparatus according to claim 2, wherein the oxygen amount of at least one of the plurality of first regions is less than 30 atoms %.

5. The electronic apparatus according to claim 3, wherein the oxygen amount of at least one of the plurality of first regions is less than 25 atoms %.

6. The electronic apparatus according to claim 1, wherein the oxygen amount of the second region is 30 atoms % or more.

7. The electronic apparatus according to claim 6, wherein the oxygen amount of the second region is 50 atoms % or less.

8. The electronic apparatus according to claim 1, wherein the oxygen amount of at least one of the plurality of first regions is 10 atoms % or more.

9. The electronic apparatus according to claim 1, wherein a nitrogen amount of at least one of the plurality of first regions is 20 atoms % or less.

10. The electronic apparatus according to claim 1, wherein a nitrogen amount of the second region is less than 10 atoms %.

11. The electronic apparatus according to claim 1, wherein a nitrogen amount of the second region is half or less of a nitrogen amount of at least one of the plurality of first regions.

12. The electronic apparatus according to claim 1, wherein the oxygen amount of the second region is twice or more the oxygen amount of at least one of the plurality of first regions.

13. The electronic apparatus according to claim 1, wherein a minimum width of the second region is 150 μm or more.

14. A method for manufacturing an electronic apparatus including a metal wiring, the method comprising:
irradiating the metal wiring with a first laser beam; and
irradiating the metal wiring with a second laser beam, the second laser beam having an energy density different from an energy density of the first laser beam, wherein
the irradiating with the first laser beam and the irradiating with the second laser beam cause the metal wiring to be formed with:
a plurality of first regions;
a second region provided between two of the plurality of first regions; and
a third region whose nitrogen amount is 20 atoms % or more,
the method further comprises forming a solder layer so as to cover the plurality of first regions, and
an oxygen amount is largest in the second region, followed by at least one of the plurality of first regions, and then by the third region.

15. The method for manufacturing an electronic apparatus according to claim 14, wherein in the irradiating with the first laser beam, a region where at least one of the plurality of first regions is formed is irradiated with the first laser beam, and in the irradiating with the second laser beam, a region where the second region is formed is irradiated with the second laser beam.

16. The method for manufacturing an electronic apparatus according to claim 14, wherein in the irradiating with the first laser beam, the region where at least one of the plurality of first regions is formed and the region where the second region is formed are irradiated with the first laser beam, and in the irradiating with the second laser beam, the region where the second region is formed is irradiated with the second laser beam.

17. The method for manufacturing an electronic apparatus according to claim 14, wherein an energy density of the second laser beam is 0.06 W/mm$^2$ or more.

18. The method for manufacturing an electronic apparatus according to claim 17, wherein the energy density of the second laser beam is 0.10 W/mm$^2$ or less.

19. The method for manufacturing an electronic apparatus according to claim 14, wherein an energy density of the first laser beam is less than 0.06 W/mm$^2$.

20. The method for manufacturing an electronic apparatus according to claim 19, wherein the energy density of the first laser beam is 0.015 W/mm$^2$ or more.

* * * * *